United States Patent
Kao et al.

(10) Patent No.: US 9,269,637 B2
(45) Date of Patent: Feb. 23, 2016

(54) THIN FILM TRANSISTOR SUBSTRATE (71) Applicant: CHUNGHWA PICTURE TUBES, LTD, Pedeh, Taoyuan (TW)

(72) Inventors: Chin-Tzu Kao, Changhua (TW); Wen-Cheng Lu, Taoyuan (TW)

(73) Assignee: CHUNGHWA PICTURE TUBES, LTD., Padeh, Taoyuan (TW)

( * ) Notice: Subject to any disclaimer, the term of this patent is extended or adjusted under 35 U.S.C. 154(b) by 0 days.

(21) Appl. No.: 14/144,300

(22) Filed: Dec. 30, 2013

(65) Prior Publication Data

US 2015/0162489 A1 Jun. 11, 2015

(30) Foreign Application Priority Data

Dec. 6, 2013 (TW) .............................. 102144790 A (51) Int. Cl.
| | |
|---|---|
| H01L 29/12 | (2006.01) |
| H01L 21/8254 | (2006.01) |
| H01L 21/70 | (2006.01) |
| H01L 29/786 | (2006.01) |
| H01L 29/66 | (2006.01) |

(52) U.S. Cl.
CPC .......... *H01L 21/8254* (2013.01); *H01L 21/707* (2013.01); *H01L 29/66969* (2013.01); *H01L 29/7869* (2013.01); *H01L 29/78606* (2013.01)

(58) Field of Classification Search
CPC ..................... H01L 29/7869; H01L 29/66742; H01L 29/24; H01L 21/16; H01L 21/479
USPC .............................................. 257/43; 438/29
See application file for complete search history.

(56) References Cited

U.S. PATENT DOCUMENTS

| | | | |
|---|---|---|---|
| 2005/0245021 A1* | 11/2005 | Hornung et al. ............... | 438/231 |
| 2013/0126859 A1 | 5/2013 | Yeh et al. | |
| 2013/0187162 A1* | 7/2013 | Miwa .............................. | 257/57 |
| 2013/0264564 A1* | 10/2013 | Park et al. ........................ | 257/43 |
| 2014/0203275 A1* | 7/2014 | Kim ................................ | 257/43 |
| 2014/0217398 A1* | 8/2014 | Chang et al. .................... | 257/43 |

FOREIGN PATENT DOCUMENTS

| | | |
|---|---|---|
| CN | 101572274 A | 11/2009 |
| CN | 101901839 A | 12/2010 |
| TW | I396314 | 5/2013 |

* cited by examiner

*Primary Examiner* — Phuc Dang (74) *Attorney, Agent, or Firm* — Muncy, Geissler, Olds & Lowe, P.C.

(57) ABSTRACT

A TFT substrate includes: a substrate; and a plurality of TFTs, wherein each of the TFTs comprises: a gate electrode, disposed on the substrate; a gate insulating layer, disposed on the substrate and covering the gate electrode; a metallic oxide active layer, disposed on the gate insulating layer; a metallic oxide protection layer, disposed on the metallic oxide active layer; an etching stop layer, disposed on the metallic oxide protection layer, wherein a first through hole and a second through hole penetrate through the etching stop layer and the metallic oxide protection layer; and a source electrode and a drain electrode, disposed in the first through hole and the second through hole respectively, and electrically connected to the metallic oxide active layer.

2 Claims, 10 Drawing Sheets

THIN FILM TRANSISTOR SUBSTRATE

CROSS-REFERENCE TO RELATED APPLICATION

This application claims the benefit of Taiwan Patent Application No. 102144790, filed on Dec. 6, 2013, which is hereby incorporated by reference for all purposes as if fully set forth herein.

BACKGROUND

1. Technical Field

The present invention relates to a thin film transistor (TFT) substrate and a method for manufacturing the same, and in particular to a TFT substrate and a method for manufacturing the same that prevent a metallic oxide active layer after film forming from being polluted by moisture in the environment and chemical liquids in manufacturing processes.

2. Related Art

With the gradual progress of a display technology, the assistance of displays makes life more convenient for people. To meet a demand for lighter and thinner displays, flat panel displays (FPDs) become the mainstream at present. Among many FPDs, liquid crystal displays (LCDs) have advantageous features such as high space utilization efficiency, low power consumption, zero radiation, and low electromagnetic interference, and are therefore popular among consumers. In particular, structure design or material selection of TFT substrates, which are heavily used in displays, directly affects performance of products.

Generally speaking, a TFT in the TFT substrate at least has members such as a gate electrode, a source electrode, a drain electrode, and a channel layer, where the electrical conductivity of the channel layer can be changed by controlling a voltage of the gate electrode, so that an electrically connected (Switch On) state or an electrically insulated (Switch Off) state is formed between the source electrode and drain electrode. Materials of channel layers are mostly amorphous silicon (a-Si). However, in recent years, indium gallium zinc oxide (IGZO) is gradually replacing the a-Si, because compared with the a-Si, the IGZO can reduce the size of the TFT, improve an aperture ratio of pixels of a liquid crystal panel, and easily achieve doubled resolution and ten-time-faster electron mobility.

However, after manufacturing processes such as film forming, lithography, and etching, the IGZO is subject to a stripping process, in which a photoresist attached on the IGZO is stripped; at this time, a surface of the IGZO is not protected by the photoresist, and therefore is prone to pollution of moisture in the environment and a chemical liquid in the stripping process, and an electrical property of the IGZO is greatly affected.

Therefore, it is necessary to provide a TFT substrate and a method for manufacturing the same to prevent the IGZO from being polluted by moisture in the environment and chemical liquids in processes.

SUMMARY

The present invention is directed to a TFT substrate and a method for manufacturing the same that prevent a metallic oxide active layer from being polluted by moisture in the environment and chemical liquids in processes.

To achieve the objective, the present invention provides a method for manufacturing a TFT substrate, including the following steps: providing a substrate; forming a gate electrode on the substrate; forming a gate insulating layer on the substrate, wherein the gate insulating layer covers the gate electrode; forming a metallic oxide layer on the gate insulating layer; forming an insulating material layer on the metallic oxide layer; removing a part of the metallic oxide layer and a part of the insulating material layer, to form a metallic oxide active layer and a metallic oxide protection layer respectively; forming a first through hole and a second through hole, wherein the first through hole and the second through hole expose an upper surface of the metallic oxide active layer, and penetrate through the metallic oxide protection layer; and disposing a source electrode and a drain electrode in the first through hole and the second through hole respectively, so that the source electrode and the drain electrode are electrically connected to the metallic oxide active layer.

To achieve the objective, the present invention further provides a method for manufacturing a TFT substrate, including the following steps: providing a substrate; forming a gate electrode on the substrate; forming a gate insulating layer on the substrate, wherein the gate insulating layer covers the gate electrode; forming a metallic oxide layer on the gate insulating layer; forming a photoresist pattern on the metallic oxide layer, wherein the photoresist pattern is located right above the gate electrode; with the photoresist pattern as a mask, removing a part of the metallic oxide layer, to form a metallic oxide active layer; removing the photoresist pattern; forming an etching stop layer on the gate insulating layer, wherein the etching stop layer covers the metallic oxide active layer; forming a first through hole and a second through hole, wherein the first through hole and the second through hole expose an upper surface of the metallic oxide active layer, and penetrate through the etching stop layer; and disposing a source electrode and a drain electrode in the first through hole and the second through hole, respectively, so that the source electrode and the drain electrode are electrically connected to the metallic oxide active layer.

To achieve the objective, the present invention further provides a TFT substrate including: a substrate; and a plurality of TFTs, wherein each of the TFTs comprises: a gate electrode, disposed on the substrate; a gate insulating layer, disposed on the substrate and covering the gate electrode; a metallic oxide active layer, disposed on the gate insulating layer; a metallic oxide protection layer, disposed on the metallic oxide active layer; an etching stop layer, disposed on the metallic oxide protection layer, wherein a first through hole and a second through hole penetrate through the etching stop layer and the metallic oxide protection layer; and a source electrode and a drain electrode, disposed in the first through hole and the second through hole, respectively, and electrically connected to the metallic oxide active layer.

According to a TFT substrate of the present invention and a method for manufacturing the same, after the film forming process of the metallic oxide layer, an insulating material layer is formed as a protection layer; after the lithography process is completed, the insulating material layer outside the photoresist pattern is removed by using a dry etching process, and the metallic oxide layer outside the photoresist pattern is removed by using a wet etching process. The insulating material layer ensures that the metallic oxide after the film forming process is not polluted by moisture in the environment and chemical liquids in the subsequent processes. In addition, the photoresist pattern located on the metallic oxide active layer can also be removed by a dry stripping process, so as to prevent a chemical liquid in a stripping process from affecting the metallic oxide active layer.

In order to make the aforementioned and other objectives and advantages of the present invention comprehensible, embodiments accompanied with figures are described in detail below.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Figure 1A:
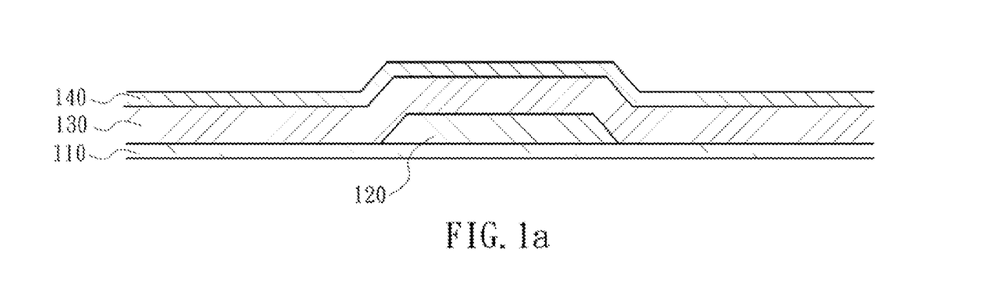
FIG. 1a to FIG. 1h are cross-sectional views showing a method for manufacturing a TFT substrate according to a first embodiment of the present invention.
Figure 1B:
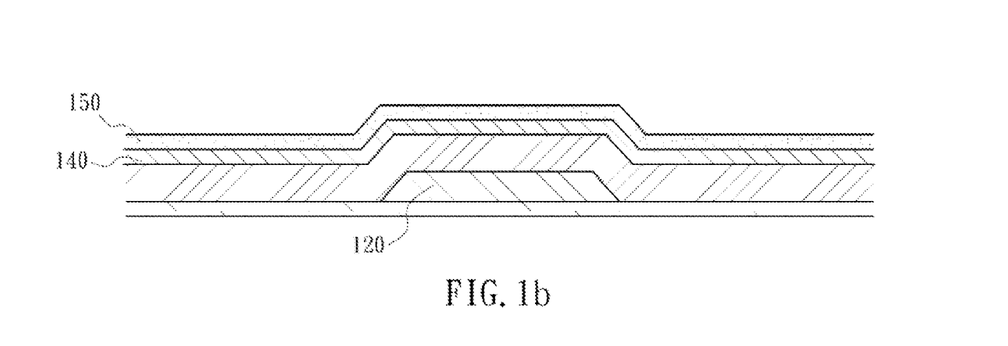
Figure 1C:
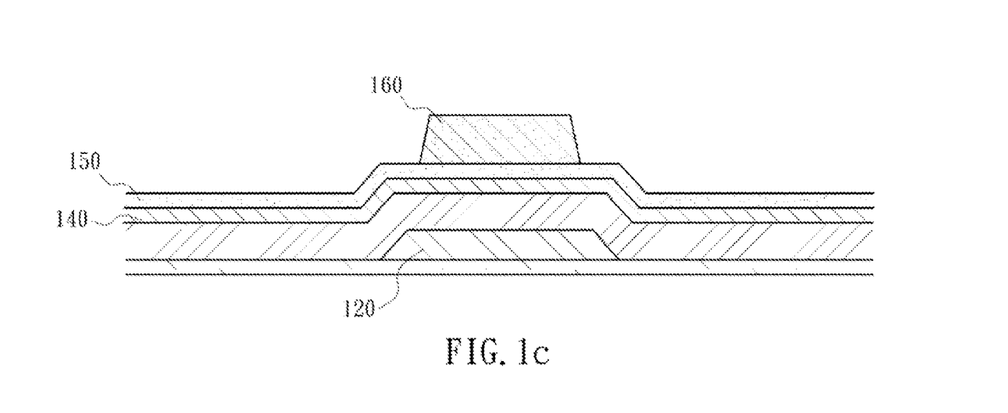
Figure 1D:
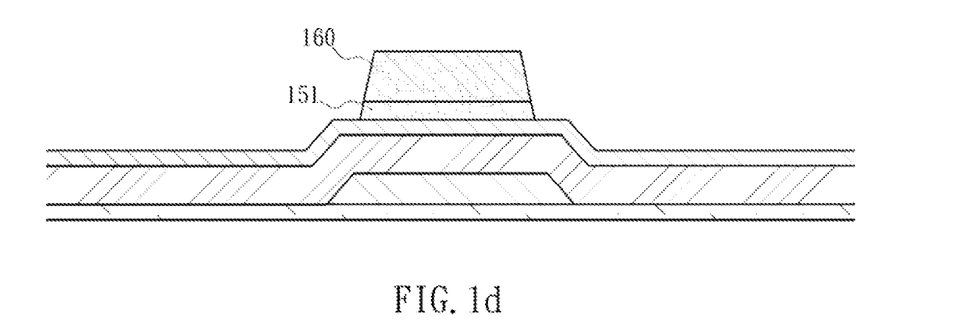
Figure 1E:
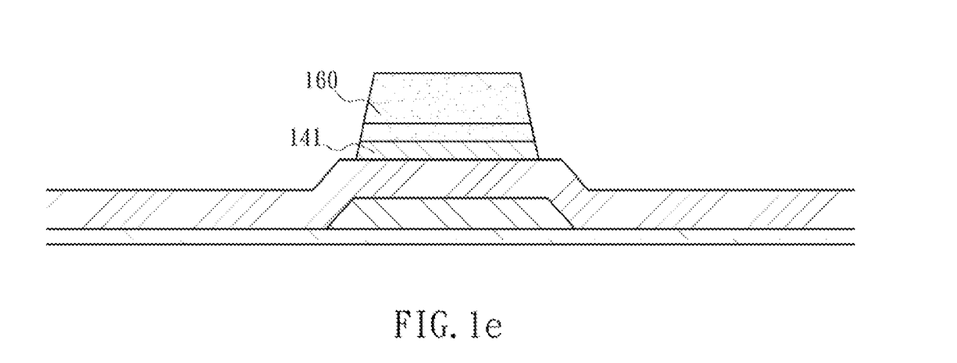
Figure 1F:
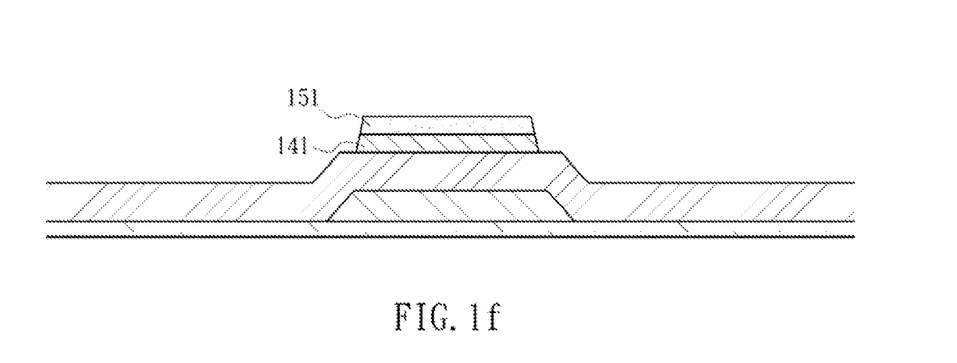
Figure 1G:
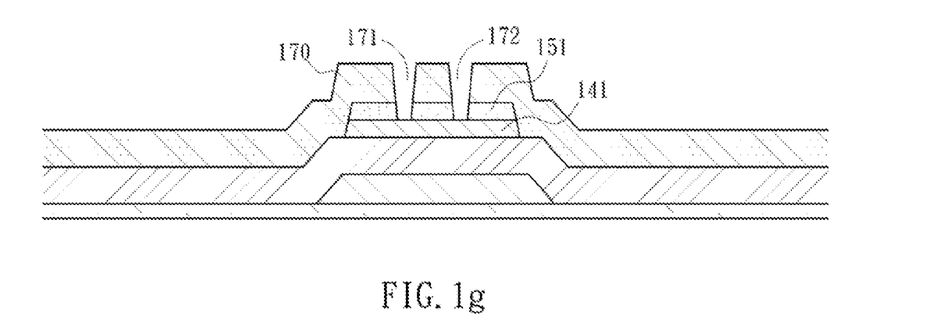
Figure 1H:
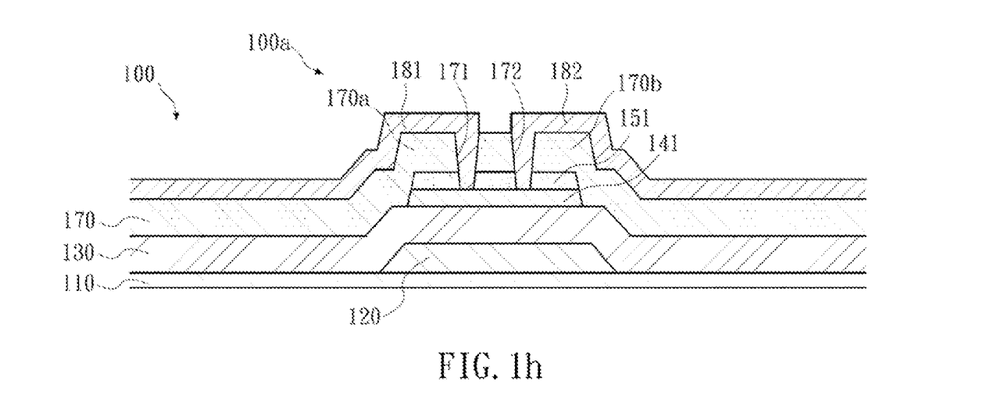
Figure 2:
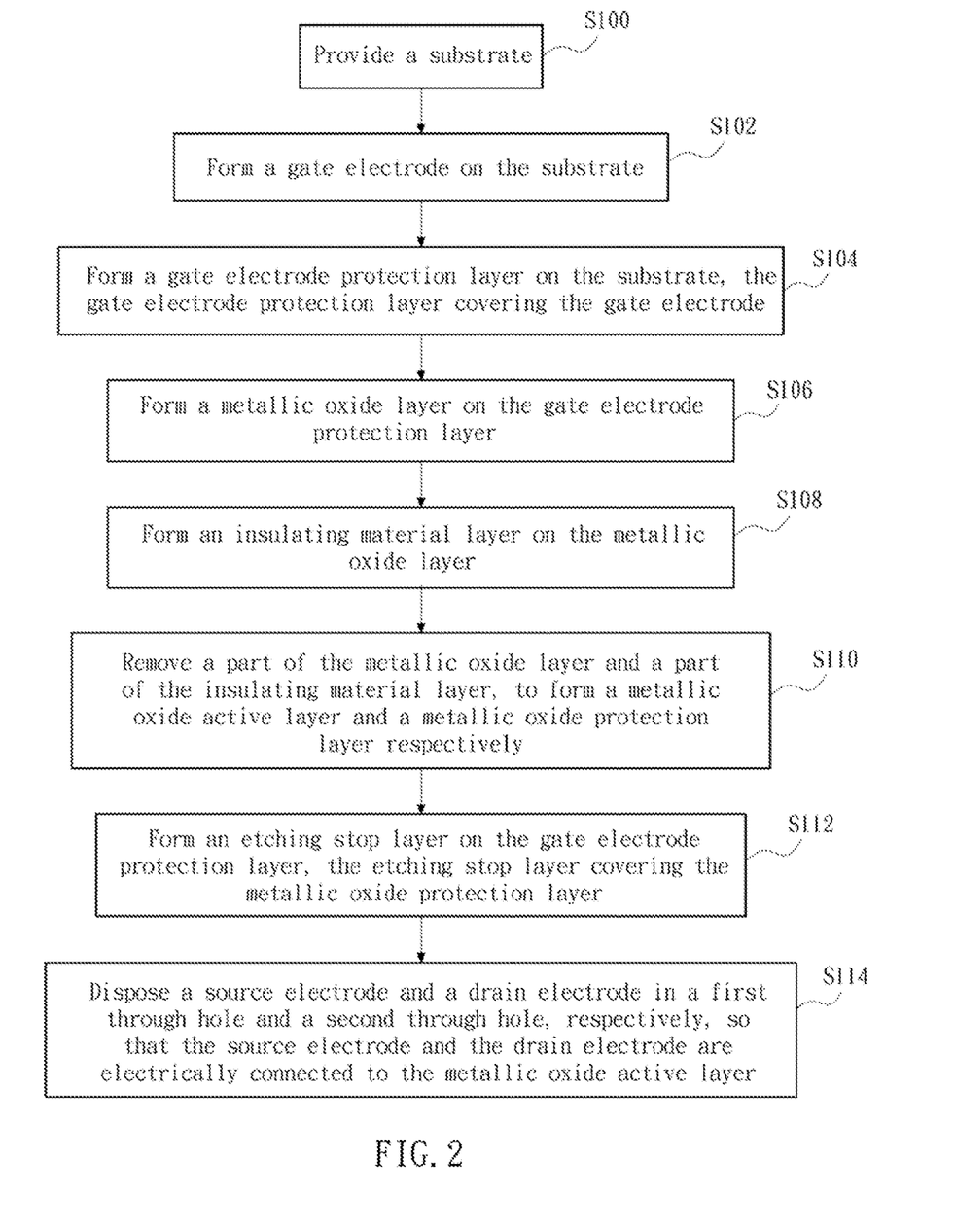
FIG. 2 is a flow chart of a method for manufacturing a TFT substrate according to the first embodiment.

FIG. 1a to FIG. 1h are cross-sectional views showing a method for manufacturing a TFT substrate according to a first embodiment of the present invention. FIG. 2 is a flow chart of a method for manufacturing a TFT substrate according to the first embodiment.

Step S100: Provide a substrate. Referring to FIG. 1a, the substrate 110 can be a glass substrate, a quartz substrate, or another substrate. The substrate 110 is a base material used for manufacturing a TFT.

Step S102: Form a gate electrode on the substrate. Referring to FIG. 1a again, a gate electrode 120 is formed on the substrate 110. A material of the gate electrode 120 is, for example, aluminum, chromium, tantalum or other metal materials, and a forming method thereof includes a thin film deposition process, a lithography process, and an etching process. The thin film deposition process can be sputtering, electroplating, spin coating, printing, electroless plating, or another suitable process.

Step S104: Form a gate insulating layer on the substrate, the gate insulating layer covering the gate electrode. Referring to FIG. 1a again, a gate insulating layer 130 is formed on the substrate 110, and covers the gate electrode 120. A material of the gate insulating layer 130 is, for example, a dielectric material such as silicon dioxide, silicon nitride, or silicon oxynitride, and a forming process thereof is, for example, chemical vapor deposition.

Step S106: Form a metallic oxide layer on the gate insulating layer. Referring to FIG. 1a again, a metallic oxide layer 140 is first formed on the gate insulating layer 130. A material of the metallic oxide layer 140 is a group II-VI compound, for example, indium zinc oxide (IZO) or indium gallium zinc oxide (IGZO). In this embodiment, that the metallic oxide layer is IGZO is used as an example for the following description. A forming process of the metallic oxide layer 140 can be a non-vacuum process, that is, a process performed in a non-vacuum chamber. In another embodiment, the forming process of the metallic oxide layer 140 can be a vacuum process, that is, a process performed in a vacuum chamber, for example, a physical vapor deposition process or a chemical vapor deposition process.

Step S108: Form an insulating material layer on the metallic oxide layer. Referring to FIG. 1b, after the metallic oxide layer 140 is formed, an insulating material layer 150 is formed on the metallic oxide layer 140. A material of the insulating material layer 150 is, for example, an insulating material such as silicon dioxide, or aluminum oxide. In a first example, after the metallic oxide layer is formed, an insulating material layer 150 made of silicon dioxide is formed on the metallic oxide layer 140 by means of, for example, plasma chemical vapor deposition (PECVD), wherein a thickness of the insulating material layer 150 made of silicon dioxide is greater than 500 angstroms. In a second example, after the metallic oxide layer is formed, the metallic oxide layer is transferred, in a vacuum environment, by a robotic arm to another coating chamber equipped with an aluminum target, so that an insulating material layer 150 made of aluminum oxide is formed on the metallic oxide layer 140 wherein a thickness of the insulating material layer 150 made of aluminum oxide is greater than 500 angstroms, too. In a third example, in the same coating chamber, a metallic oxide target (which can be an IGZO target) can be directly switched to an aluminum target in a multi-cathode manner, and then an insulating material layer 150 made of aluminum oxide is formed on the metallic oxide layer 140.

Step S110: Remove a part of the metallic oxide layer and a part of the insulating material layer, to form a metallic oxide active layer and a metallic oxide protection layer respectively. Referring to FIG. 1c, a photosensitive material layer with a uniform thickness is first formed on the insulating material layer 150. A process for forming the photosensitive material layer is, for example, spin coating process in combination with a post-baking process. Then, the photosensitive material layer is subject to an exposure process and a development process, to form a first photoresist pattern 160. The first photoresist pattern 160 is on the insulating material layer 150, and is located right above the gate electrode 120. Referring to FIG. 1d, with the first photoresist pattern 160 as a mask, a part of the insulating material layer 150 is removed by using a dry etching process, so as to form the metallic oxide protection layer 151. Referring to FIG. 1e, in the same way, with the first photoresist pattern 160 as a mask, a part of the metallic oxide layer 140 is removed by using a wet etching process, so as to form the metallic oxide active layer 141. Referring to FIG. 1f, after the metallic oxide active layer 141 and the metallic oxide protection layer 151 are formed, the first photoresist pattern 160 is removed by a wet stripping process. The metallic oxide protection layer 151 can prevent a chemical liquid in the subsequent wet stripping process of the first photoresist pattern 160 from polluting the metallic oxide active layer 141. When the thickness of the metallic oxide protection layer 151 is greater than 500 angstroms, the metallic oxide protection layer 151 can effectively prevent the chemical liquid in the wet stripping process from polluting the metallic oxide active layer 141.

Step S112: Form an etching stop layer on the gate insulating layer, the etching stop layer covering the metallic oxide protection layer. Referring to FIG. 1g, the metallic oxide protection layer 151 and the etching stop layer 170 have the same material, so the forming process of the metallic oxide protection layer 151 described in Step S110 can be used to pattern the etching stop layer 170 and the metallic oxide protection layer 151, and form a first through hole 171 and a second through hole 172. The first through hole 171 and the second through hole 172 expose an upper surface of the metallic oxide active layer 141, and penetrate through the etching stop layer 170 and the metallic oxide protection layer 151.

Step S114: Dispose a source electrode and a drain electrode in the first through hole and the second through hole respectively, so that the source electrode and the drain electrode are electrically connected to the metallic oxide active layer. Referring to FIG. 1h, a material of the source electrode 181 and the drain electrode 182 is, for example, aluminum, chromium, tantalum or another metal material, and a forming process thereof includes processes such as a thin film deposition process, a lithography process, and an etching process. The etching process is, for example, a dry etching process using plasma or a wet etching process using an etching solution. The source electrode 181 and the drain electrode 182 are not only formed on the metallic oxide active layer 141 but also formed on an upper surface of the etching stop layer 170.

Referring to FIG. 1h again, the TFT substrate 100 includes a substrate 110 and a plurality of TFT's 100a. Each of the TFT's can be formed by using Step S100 to Step S114. The gate electrode 120 is disposed on the substrate 110. The gate insulating layer 130 is disposed on the substrate 110 and covers the gate electrode 120. The metallic oxide active layer 141 is disposed on the gate insulating layer 130. The metallic oxide protection layer 151 is disposed on the metallic oxide active layer 141. The first through hole 171 and the second through hole 172 are located on the upper surface of the metallic oxide active layer 141, and penetrate through the etching stop layer 170 and the metallic oxide protection layer 151. The source electrode 181 and the drain electrode 182 are disposed in the first through hole 171 and the second through hole 172 respectively, and are electrically connected to the metallic oxide active layer 141. The metallic oxide protection layer 151 and the etching stop layer 170 have the same material, and the total thickness of the metallic oxide protection layer 151 and the etching stop layer 170a that are located right above the gate electrode 120 is greater than the thickness of the etching stop layer 170b located at two sides of the gate electrode 120.

Figure 3A:
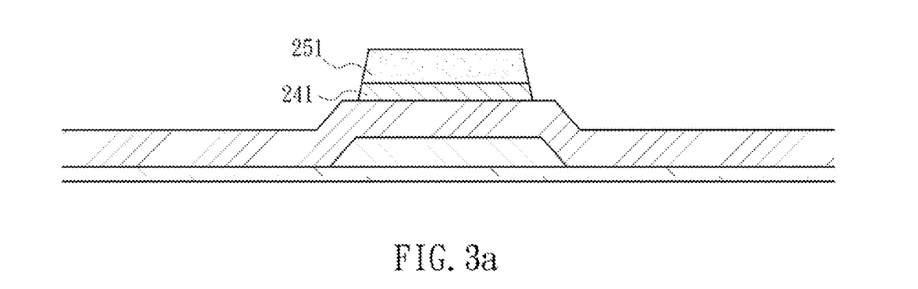
FIG. 3a to FIG. 3e are cross-sectional views showing a method for manufacturing a TFT substrate according to a second embodiment of the present invention.
Figure 3B:
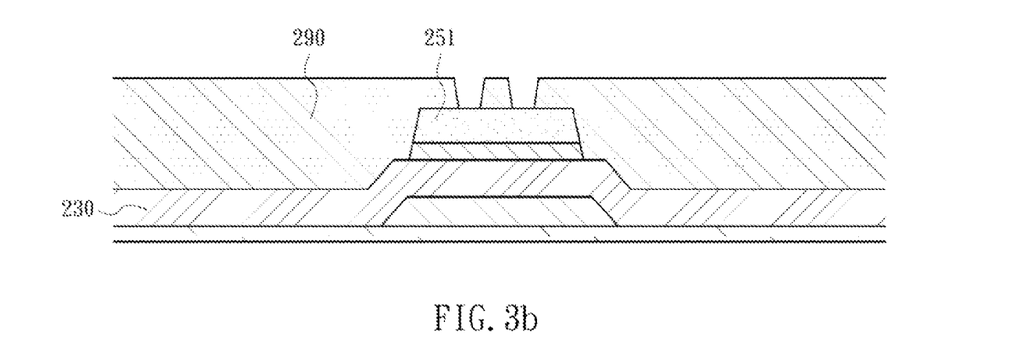
Figure 3C:
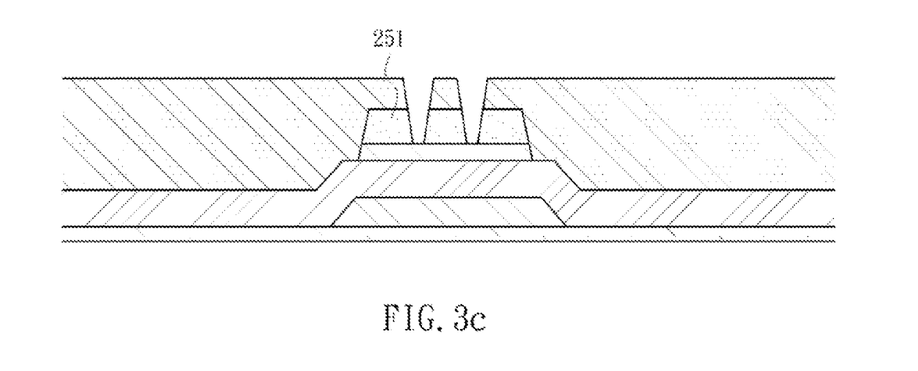
Figure 3D:
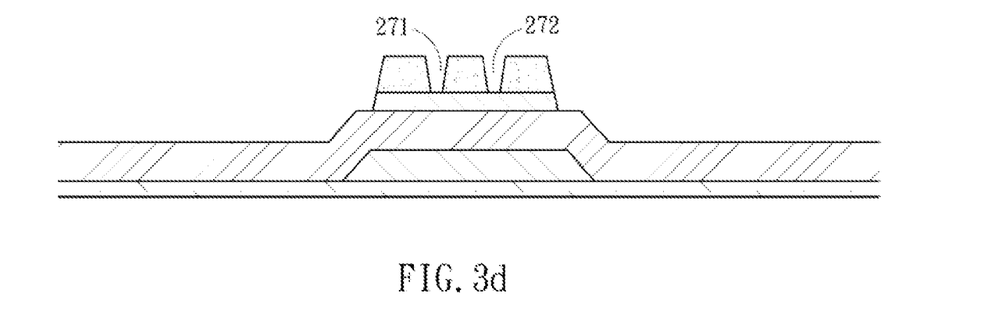
Figure 3E:
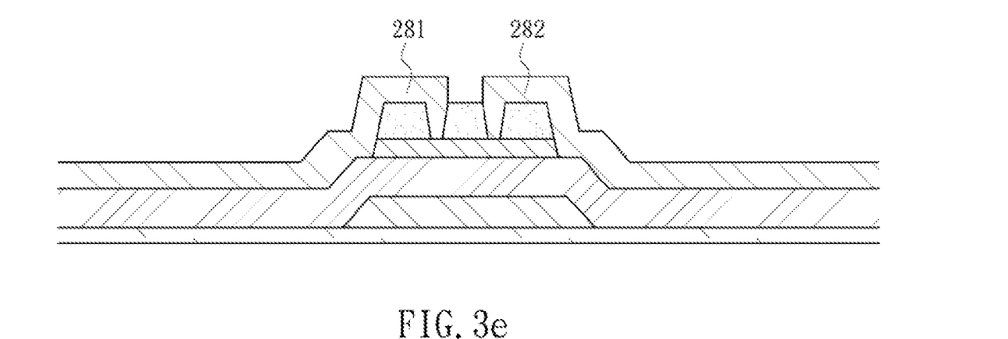
Figure 4:
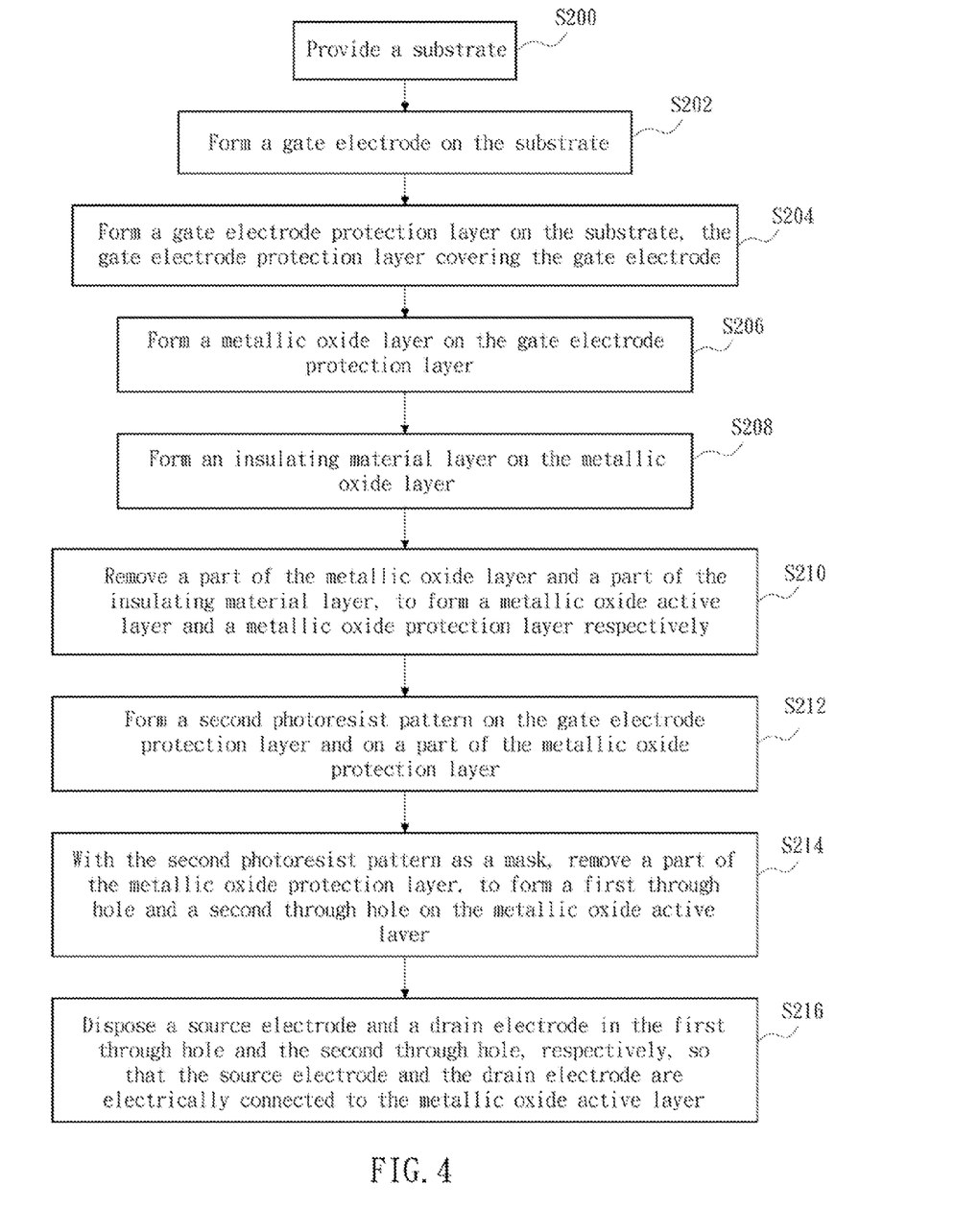
FIG. 4 is a flow chart of a method for manufacturing a TFT substrate according to the second embodiment.

FIG. 3a to FIG. 3e are cross-sectional views showing a method for manufacturing a TFT substrate according to a second embodiment of the present invention. FIG. 4 is a flow chart of a method for manufacturing a TFT substrate according to the second embodiment.

Step S200: Provide a substrate. This step is the same as Step S100, and is not described again.

Step S202: Form a gate electrode on the substrate. This step is the same as Step S102, and is not described again.

Step S204: Form a gate insulating layer on the substrate, the gate insulating layer covering the gate electrode. This step is the same as Step S104, and is not described again.

Step S206: Form a metallic oxide layer on the gate insulating layer. This step is the same as Step S106, and is not described again.

Step S208: Form an insulating material layer on the metallic oxide layer. This step is the same as Step S108, and is not described again.

Step S210: Remove a part of the metallic oxide layer and a part of the insulating material layer by using an etching process, to form a metallic oxide active layer and a metallic oxide protection layer respectively. This step is the same as Step S110, and is not described again. As shown in FIG. 3a, the metallic oxide protection layer 251 can prevent a chemical liquid in a subsequent wet stripping process of a first photoresist pattern from polluting the metallic oxide active layer 241. Furthermore, in the second embodiment, the metallic oxide protection layer 251 is thickened, so as to substitute for the etching stop layer in the first embodiment.

Step S212: Form a second photoresist pattern on the gate insulating layer and on a part of the metallic oxide protection layer. Referring to FIG. 3b, a photosensitive material layer with a uniform thickness is formed on the gate insulating layer 230 and the metallic oxide protection layer 251. A process for forming the photosensitive material layer is, for example, spin coating process in combination with a post-baking process. Then, the photosensitive material layer is subject to an exposure process and a development process, so as to form the second photoresist pattern 290.

Step S214: With the second photoresist pattern as a mask, remove a part of the metallic oxide protection layer, to form a first through hole and a second through hole on an upper surface of the metallic oxide active layer. Referring to FIG. 3c, a part of the metallic oxide protection layer 251 can be removed by a dry etching process, and the metallic oxide protection layer 251 is patterned, so as to form a first through hole 271 and a second through hole 272. The first through hole 271 and the second through hole 272 expose the upper surface of the metallic oxide active layer 241, and penetrate through the metallic oxide protection layer 251. Referring to FIG. 3d, after the first through hole 271 and the second through hole 272 are formed, the second photoresist pattern is removed by a wet stripping process.

Step S216: Dispose a source electrode and a drain electrode in the first through hole and the second through hole respectively, so that the source electrode and the drain electrode are electrically connected to the metallic oxide active layer. Referring to FIG. 3e, a material of the source electrode 281 and the drain electrode 282 is, for example, aluminum, chromium, tantalum or another metal material, and a forming process thereof includes processes such as a thin film deposition process, a lithography process, and an etching process. The etching process is, for example, a dry etching process using plasma or a wet etching process using an etching solution.

Figure 5A:
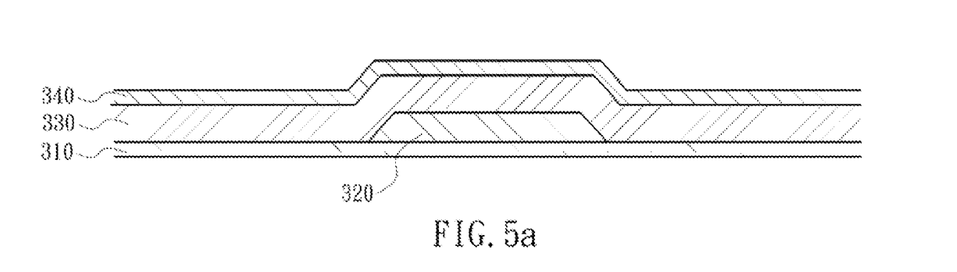
FIG. 5a to FIG. 5f are cross-sectional views showing a method for manufacturing a TFT substrate according to a third embodiment of the present invention.
Figure 5B:
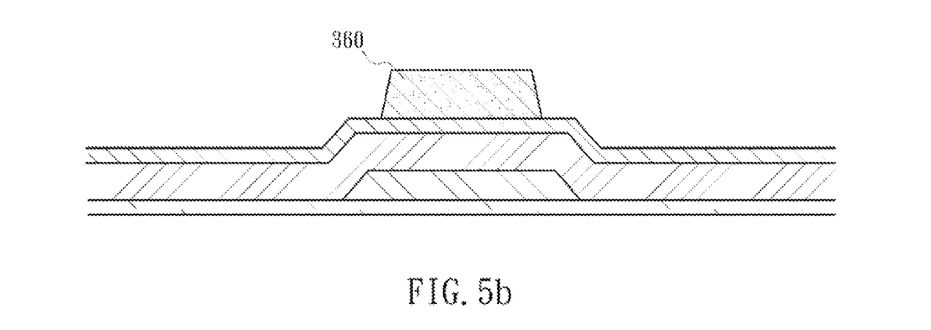
Figure 5C:
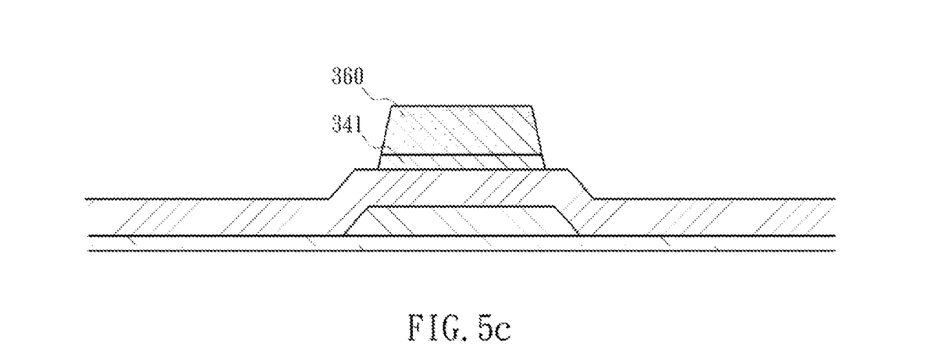
Figure 5D:
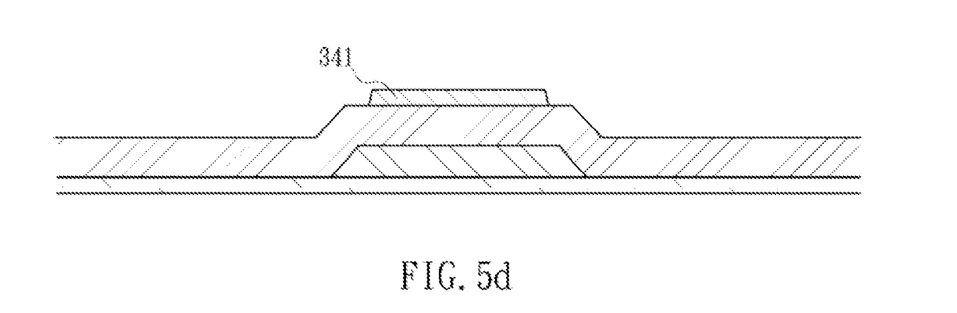
Figure 5E:
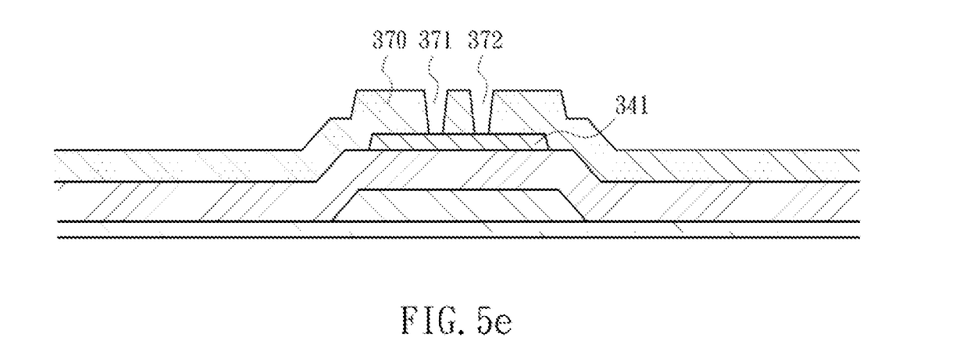
Figure 5F:
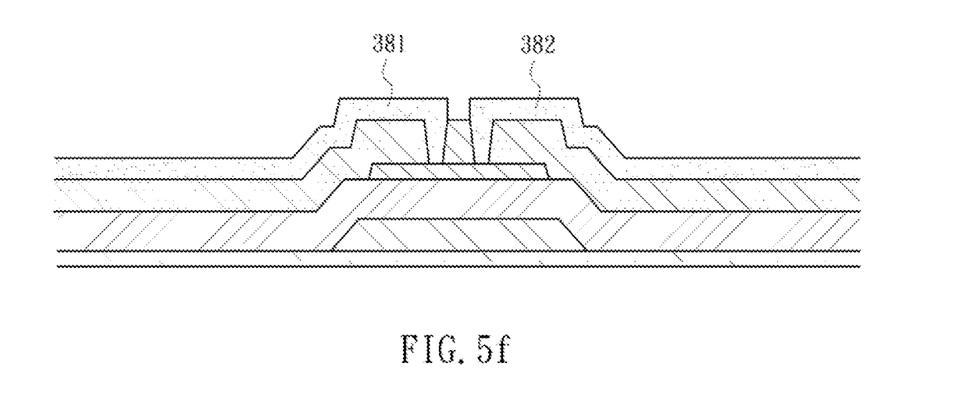
Figure 6:
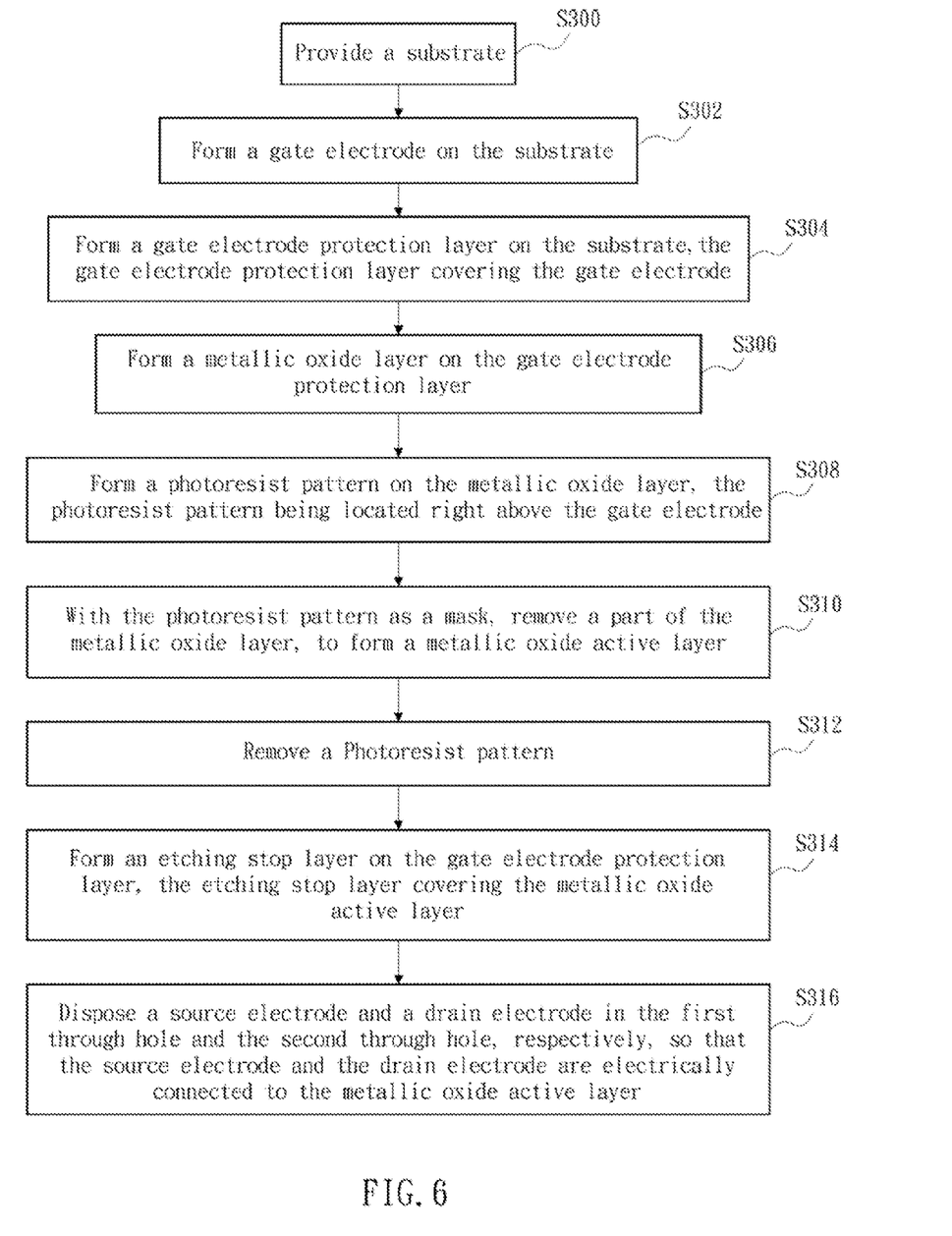
FIG. 6 is a flow chart of a method for manufacturing a TFT substrate according to the third embodiment.

FIG. 5a to FIG. 5f are cross-sectional views showing a method for manufacturing a TFT substrate according to a third embodiment of the present invention. FIG. 6 is a flow chart of a method for manufacturing a TFT substrate according to the third embodiment.

Step S300: Provide a substrate. This step is the same as Step S100, and is not described again.

Step S302: Form a gate electrode on the substrate. This step is the same as Step S102, and is not described again.

Step S304: Form a gate insulating layer on the substrate, the gate insulating layer covering the gate electrode. This step is the same as Step S104, and is not described again.

Step S306: Form a metallic oxide layer on the gate insulating layer. This step is the same as Step S106, and is not described again. FIG. 5a is a cross-sectional view of a part of the TFT substrate formed by using Step S300 to Step S306, and shows that the gate electrode 320 is disposed on the substrate 310. The gate insulating layer 330 is disposed on the substrate 310, and covers the gate electrode 320. The metallic oxide layer 340 is disposed on the gate insulating layer 330.

Step S308: Form a photoresist pattern on the metallic oxide layer, the photoresist pattern being located right above the gate electrode. Referring to FIG. 5b, a forming process of the photoresist pattern 360 is the same as Step S212, and is not described again.

Step S310: With the photoresist pattern as a mask, remove a part of the metallic oxide layer, to form a metallic oxide active layer. Referring to FIG. 5c, with the photoresist pattern 360 as a mask, a part of the metallic oxide layer 340 is removed by a wet etching process, so as to form the metallic oxide active layer 341.

Step S312: Remove a photoresist pattern. Referring to FIG. 5d, the photoresist pattern 360 on the metallic oxide active layer 341 is removed by a dry stripping (such as $O_2$ ashing) process (as shown in FIG. 5c).

Step S314: Form an etching stop layer on the gate insulating layer, the etching stop layer covering the metallic oxide active layer. Referring to FIG. 5e, the forming process of the metallic oxide protection layer described in Step S110 is used to pattern the etching stop layer 370, and form a first through hole 371 and a second through hole 372. The first through hole 371 and the second through hole 372 expose an upper surface of the metallic oxide active layer 341, and penetrate through the etching stop layer 370.

Step S316: Dispose a source electrode and a drain electrode in the first through hole and the second through hole respectively, so that the source electrode and the drain electrode are electrically connected to the metallic oxide active layer. Referring to FIG. 5f, a forming process of the source electrode 381 and the drain electrode 382 is the same as Step S216, and is not described again.

In sum, in the first embodiment of the present invention, after the film forming process of the metallic oxide layer, an insulating material layer is formed as a protection layer; after the lithography process is completed, the insulating material layer outside the photoresist pattern is removed by using a dry etching process, and the metallic oxide layer outside the photoresist pattern is removed by using a wet etching process. The insulating material layer ensures that the metallic oxide after the film forming process is not polluted by moisture in the environment and chemical liquids in the subsequent processes. In the second embodiment of the present invention, the metallic oxide protection layer is thickened to substitute for the etching stop layer in the first embodiment. In the third embodiment of the present invention, the photoresist pattern located on the metallic oxide active layer can also be removed by a dry stripping process, so as to prevent a chemical liquid in a stripping process from affecting the metallic oxide active layer.

As described above, implementation manners or embodiments are merely for presenting the technical means employed in the present invention to solve the problems, and these implementation manners or embodiments are not intended to limit the implementation scope of the present invention. Any equivalent change and modification made in consistency with the content of the scope of the present invention or in accordance with the scope of the present invention shall fall within the scope of the present invention.

What is claimed is:

1. A TFT substrate, comprising:
   a substrate; and
   a plurality of TFTs, wherein each of the TFTs comprises:
   a gate electrode, disposed on the substrate;
   a gate insulating layer, disposed on the substrate and covering the gate electrode;
   a metallic oxide active layer, disposed on the gate insulating layer;
   a metallic oxide protection layer, disposed on the metallic oxide active layer;
   an etching stop layer, disposed on the metallic oxide protection layer, wherein a first through hole and a second through hole penetrate through the etching stop layer and the metallic oxide protection layer; and
   a source electrode and a drain electrode, disposed in the first through hole and the second through hole respectively, and electrically connected to the metallic oxide active layer;
   wherein a material of the metallic oxide protection layer and a material of the etching stop layer are the same, and a total thickness of the metallic oxide protection layer and the etching stop layer that are located right above the gate electrode is greater than a thickness of the etching stop layer located at two sides of the gate electrode.

2. The TFT substrate according to claim 1, wherein a material of the metallic oxide active layer is indium gallium zinc oxide (IGZO), and a thickness of the metallic oxide protection layer is greater than 500 angstroms.

* * * * *